(12) United States Patent
Zeng (10) Patent No.: US 11,120,587 B2
(45) Date of Patent: Sep. 14, 2021

(54) METHOD AND DEVICE FOR DRAWING INTERSECTION, SERVER AND STORAGE MEDIUM

(71) Applicant: BAIDU ONLINE NETWORK TECHNOLOGY (BEIJING) CO., LTD., Beijing (CN)

(72) Inventor: Yi Zeng, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/826,683

(22) Filed: Mar. 23, 2020

(65) Prior Publication Data
US 2020/0311991 A1    Oct. 1, 2020

(30) Foreign Application Priority Data

Mar. 27, 2019    (CN) .......................... 201910239884.9

(51) Int. Cl.
*G06T 11/00*    (2006.01)
*G06T 11/20*    (2006.01)
*G06F 30/13*    (2020.01)

(52) U.S. Cl.
CPC ............ *G06T 11/203* (2013.01); *G06F 30/13* (2020.01)

(58) Field of Classification Search
CPC .... G01C 21/36; G01C 21/3667; G01C 21/32; G06T 11/20; G09B 29/10; G09B 29/106
See application file for complete search history.

(56) References Cited

U.S. PATENT DOCUMENTS

| | | | | |
|---|---|---|---|---|
| 6,792,071 B2 * | 9/2004 | Dewaele | ............... | G06T 7/0012 |
| | | | | 378/51 |
| 7,203,942 B2 * | 4/2007 | Lafruit | .................. | G06F 9/5027 |
| | | | | 718/100 |
| 7,647,174 B2 * | 1/2010 | Kwon | .................... | G01C 21/30 |
| | | | | 701/412 |

(Continued)

FOREIGN PATENT DOCUMENTS

CN    107478201 A    12/2017
CN    109297501 A    2/2019
(Continued)

OTHER PUBLICATIONS

Extended European Search Report for EP Application No. 20165079. 3, dated Jul. 24, 2020, 8 pages.
(Continued)

*Primary Examiner* — Martin Mushambo
(74) *Attorney, Agent, or Firm* — Fay Sharpe LLP (57) ABSTRACT

Embodiments of the present disclosure disclose a method and a device for drawing an intersection, a server and a storage medium. The method includes: acquiring road lines of all branches at the intersection based on vector data of the intersection; performing a line-to-surface expansion based on the road lines to obtain road surfaces, and acquiring two side lines of each of the road surfaces; and determining target side line pairs based on side lines of the intersection, and drawing a corner arc at a corner of each of the target side line pairs. Each of the target side line pairs includes two side lines that do not belong to the same road line and are adjacent to each other.

18 Claims, 5 Drawing Sheets

(56) References Cited

U.S. PATENT DOCUMENTS

| | | | | |
|---|---|---|---|---|
| 8,355,864 B2* | 1/2013 | Kida | ............... | G06F 16/29 |
| | | | | 701/446 |
| 10,001,378 B2* | 6/2018 | Mund | ............... | G09B 29/106 |
| 10,288,434 B2* | 5/2019 | Dorum | ............... | G01C 21/30 |
| 10,332,290 B2* | 6/2019 | Beri | ............... | G06T 11/40 |
| 10,482,577 B2* | 11/2019 | Beri | ............... | G06T 11/40 |
| 2001/0012981 A1* | 8/2001 | Yamashita | ............... | G01C 21/3626 |
| | | | | 701/410 |
| 2005/0228584 A1* | 10/2005 | Adachi | ............... | G09B 29/106 |
| | | | | 701/448 |
| 2006/0037990 A1* | 2/2006 | Geise | ............... | G09B 29/10 |
| | | | | 228/101 |
| 2010/0110093 A1* | 5/2010 | Nystad | ............... | G06T 11/203 |
| | | | | 345/584 |
| 2010/0289801 A1* | 11/2010 | Nachmanson | ............... | G06T 11/206 |
| | | | | 345/440 |
| 2012/0069037 A1* | 3/2012 | Ziemski | ............... | G06T 11/203 |
| | | | | 345/586 |
| 2013/0298097 A1* | 11/2013 | Chang | ............... | G06F 30/3312 |
| | | | | 716/113 |
| 2013/0328916 A1* | 12/2013 | Arikan | ............... | G06T 11/20 |
| | | | | 345/619 |
| 2015/0371435 A1* | 12/2015 | Zhu | ............... | G06T 15/60 |
| | | | | 345/426 |
| 2016/0275710 A1* | 9/2016 | Yoo | ............... | G06K 9/6267 |
| 2017/0122752 A1* | 5/2017 | Feng | ............... | G01C 21/34 |
| 2018/0121575 A1* | 5/2018 | Jung | ............... | G06F 30/327 |
| 2018/0348767 A1* | 12/2018 | Jafari Tafti | ............... | G08G 1/163 |

FOREIGN PATENT DOCUMENTS

| | | |
|---|---|---|
| JP | H0683937 A | 3/1994 |
| JP | H09304106 A | 11/1997 |
| JP | 2001215129 A | 8/2001 |
| WO | 2017166687 A1 | 10/2017 |

OTHER PUBLICATIONS

Office Action for Korean Application No. 10-2020-0032461, dated May 24, 2021, 6 pages.

Office Action for Japanese Application No. 2020-057454, dated Apr. 6, 2021, 5 pages.

* cited by examiner

METHOD AND DEVICE FOR DRAWING INTERSECTION, SERVER AND STORAGE MEDIUM

CROSS-REFERENCE TO RELATED APPLICATIONS

This application is based on and claims priority to Chinese Patent Application No. 201910239884.9, filed with the National Intellectual Property Administration of P. R. China on Mar. 27, 2019, the entire contents of which are incorporated herein by reference.

TECHNICAL FIELD

Embodiments of the present disclosure relate to the field of maps, and more particularly, to a method and a device for drawing an intersection, a server and a storage medium.

BACKGROUND

With the development of intelligent terminals and Internet technologies, people's travel and navigation maps are becoming inseparable, and people's requirements for map clarity are becoming higher. Due to the complexity of roads, especially the crisscross intersections, the clarity and presentation of the road in the map play an important role in guiding people correctly.

SUMMARY

Embodiments of the present disclosure provides a method for drawing an intersection. The method includes: acquiring road lines of all branches at the intersection based on vector data of the intersection; performing a line-to-surface expansion based on the road lines to obtain road surfaces, and acquiring two side lines of each of the road surfaces; and determining target side line pairs based on side lines of the intersection, and drawing a corner arc at a corner of each of the target side line pairs. Each of the target side line pairs includes two side lines that do not belong to the same road line and are adjacent to each other.

Embodiments of the present disclosure further provides a computer readable storage medium having stored thereon a computer program that, when executed by a processor, causes the processor to implements the method for drawing an intersection according to any one of the embodiments as described above.

DETAILED DESCRIPTION

The present disclosure will be described in detail below with reference to the accompanying drawings and embodiments. It should be understood that, the embodiments described herein are only used to explain the present disclosure, rather than to limit the present disclosure. In addition, it should also be noted that, for convenience of description, only part but not all structures related to the present disclosure are illustrated in the accompanying drawings.

In the related art, the high-definition intersection is generally drawn manually or by calculating a convex hull. Although the intersection drawn manually may be well presented, this manner requires the operator to have rich professional knowledge, be proficient in using drawing software, and this manner also has complex operations, long cycles, and slow update speeds, and for tens of millions of intersections, this manner is difficult to deal with quickly. Although the convex hull calculation method is simple to realize and can quickly construct a simple intersection, this manner has poor presentation effect, which is far from the actual intersection shape.

Figure 1A:
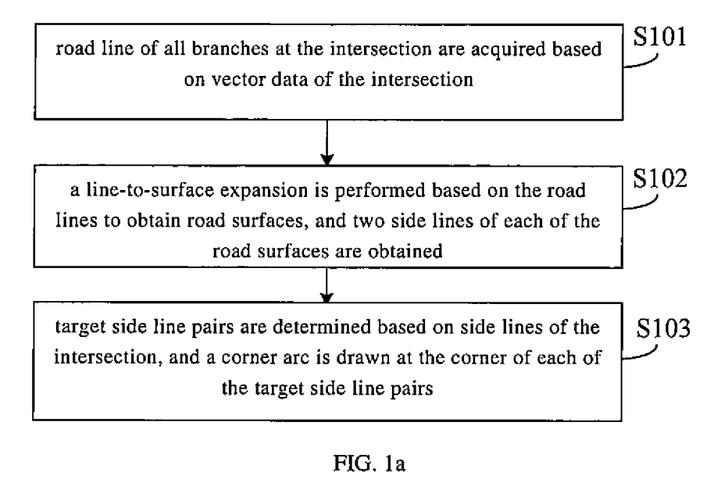
FIG. 1a is a flowchart of a method for drawing an intersection according to some embodiments of the present disclosure.

FIG. 1a is a flowchart of a method for drawing an intersection according to some embodiments of the present disclosure. The embodiment may be applied to the case of drawing a high-definition intersection. The method may be performed by a device for drawing an intersection, and the device may be implemented by software and/or hardware, and be configured in a server. As shown in FIG. 1a, the method may include the following operations.

At block S101, road line of all branches at the intersection are acquired based on vector data of the intersection.

The raw data of the base map may include vector data of the intersection, which includes line data and line relationship data of any intersection, and records the road line of each of the branches at the intersection and the intersection point of each road line, and the road lines of all branches at the intersection can be acquired according to the line data and the line relationship data. In some actual application scenarios, an N table is generally configured to represent the line relationship. The N table records coordinates of the feature point N of the intersection, i.e., the intersection point of respective road lines, and road segment data of all branches associated with the feature point N at the intersection, i.e., the road line. Illustratively, the feature point N may be the center point of the intersection.

At block S102, a line-to-surface expansion is performed based on the road lines to obtain road surfaces, and two side lines of each of the road surfaces are obtained.

Since the roads at actual intersections are surfaces rather than lines, it is necessary to convert the line data into surface data, the line-to-surface expansion may be performed based on each road line to obtain the road surfaces of all branches at the intersection. In each road surface, the two sides parallel to the road line are the side lines, and each road surface has two side lines.

In some embodiments, the line-to-surface expansion may include acts of: based on each road line, expanding to both sides of the road line by taking an intersection width as the expansion distance, to obtain the two side lines of each of the road surfaces of all branches at the intersection. In an example, the feature point N is the center point of the intersection, and the road line is the center line of the branch, thus expansion to both sides of the center line may be performed by taking each road line as the center line and half of the intersection width as the expansion distance, and road surfaces of all branches at the intersection may be obtained. The expansion distance to the both sides of the center line may be a distance of other lengths determined according to the intersection width, which is not limited in the present disclosure.

Figure 1B:
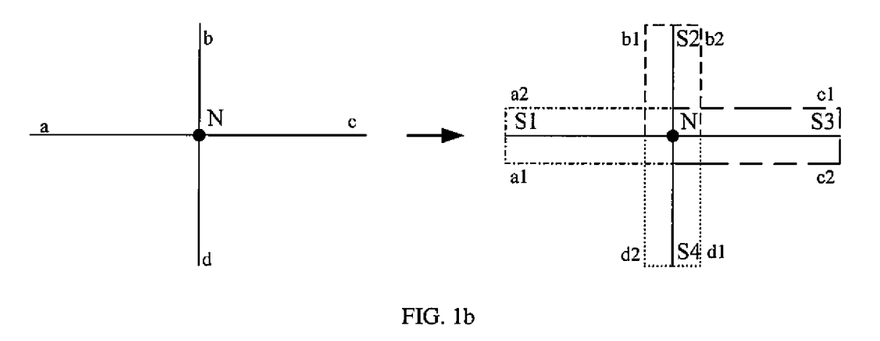
FIG. 1b is a schematic diagram illustrating road lines and road surfaces according to some embodiments of the present disclosure.

FIG. 1b is a schematic diagram illustrating road lines and road surfaces according to some embodiments of the present disclosure, as shown in FIG. 1b, the point N is the center point of the intersection, four lines a, b, c, and d are four road lines of four branches, and S1, S2, S3 and S4 are four road surfaces obtained by line-to-surface expansion. The side lines of the road surface S1 include a1 and a2, the side lines of the road surface S2 include b1 and b2, the side lines of the road surface S3 include c1 and c2, and the side lines of the road surface S4 include d1 and d2.

At block S103, target side line pairs are determined based on side lines of the intersection, and a corner arc is drawn at the corner of each of the target side line pairs.

In some embodiments, each of the target side line pairs may include two side lines that do not belong to the same road line and are adjacent to each other. In actual intersections, most corners of two adjacent branches are not right angles, and are arc, thus the two side lines that need to draw the arc needs to be found based on the road surfaces, and the corner arc needs to be drawn at the corner of each target side line pair. The two side lines in the target side line pair that needs to draw the corner arc belong to different road lines and are adjacent to each other. In an example, as illustrated in FIG. 1b, taking the road line as the center line, a2 and b1, b2 and c1, c2 and d1, and d2 and a1 are four target side line pairs.

Figure 1C:
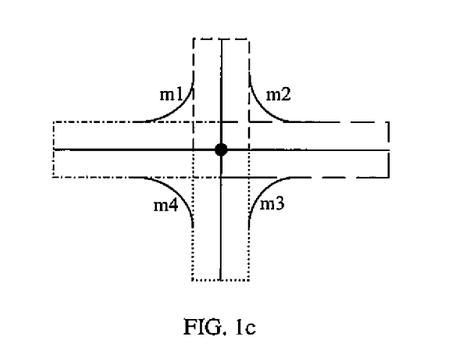
FIG. 1c is a schematic diagram illustrating corner arcs according to some embodiments of the present disclosure.

In some embodiments of the present disclosure, the corner arc may be drawn by, for example, an arc function, a five-point smoothing method, a spline interpolation method, or a linear fitting method, and the complexity and effect of different methods may be different. In an example, a Bezier curve function may be used to draw the corner arc, the Bezier curve may ensure that the drawn arc is tangent to the side line with as few interpolation points as possible, the smooth transition effect may be implemented by using the Bezier curve function. Illustratively, FIG. 1c is a schematic diagram illustrating corner arcs according to some embodiments of the present disclosure, as shown in FIG. 1c, taking the road line as the center line as an example, m1, m2, m3 and m4 are four corner arcs drawn.

In some embodiments, the method further includes: drawing, according to the vector data, a road convex hull based on the road surfaces of the intersection by using a convex hull method. In the road convex hull, the road corner is represented by a straight line. After the corner arc in the corner of the target side line pair is drawn, the method further includes: replacing the straight line in the road convex hull with the corner arc.

The convex hull method such as Graham scan method or Jarvis stepping method may realize enclosing all the determined points with a convex polygon. In drawing the intersection, the convex hull method may be configured to draw a simple intersection, the corner of the road is represented by the straight line in the simple intersection, and the actual situation of the intersection cannot be presented. It should be noted that, due to the imperfection of basic road vector data, the road line and the road surface may not be obtained based on the vector data, and it may be impossible to ensure that the corner arc can be drawn at the corners of all target side line pairs. By drawing the simple intersection using the convex hull method, and replacing the straight line at the corner in the road convex hull with the corner arc drawn, the problem of missing partial intersection when the corner arc cannot be drawn using the vector data can be avoided, thereby ensuring the integrity of the intersection drawn.

With the method according to embodiments of the present disclosure, the road lines all branches at the intersection are obtained based on the vector data of the intersection, the road surfaces are acquired by line-to-surface expansion, and a rough intersection is drawn, and then by drawing the corner arc at the target side line pair, a fine intersection can be obtained, such that the high-definition intersection can be drawn quickly, the intersection can be drawn in fine detail, the costs of manual drawing can be reduced, the drawn intersection is close to the real world, and the accuracy of drawing the intersection can be improved.

Figure 2A:
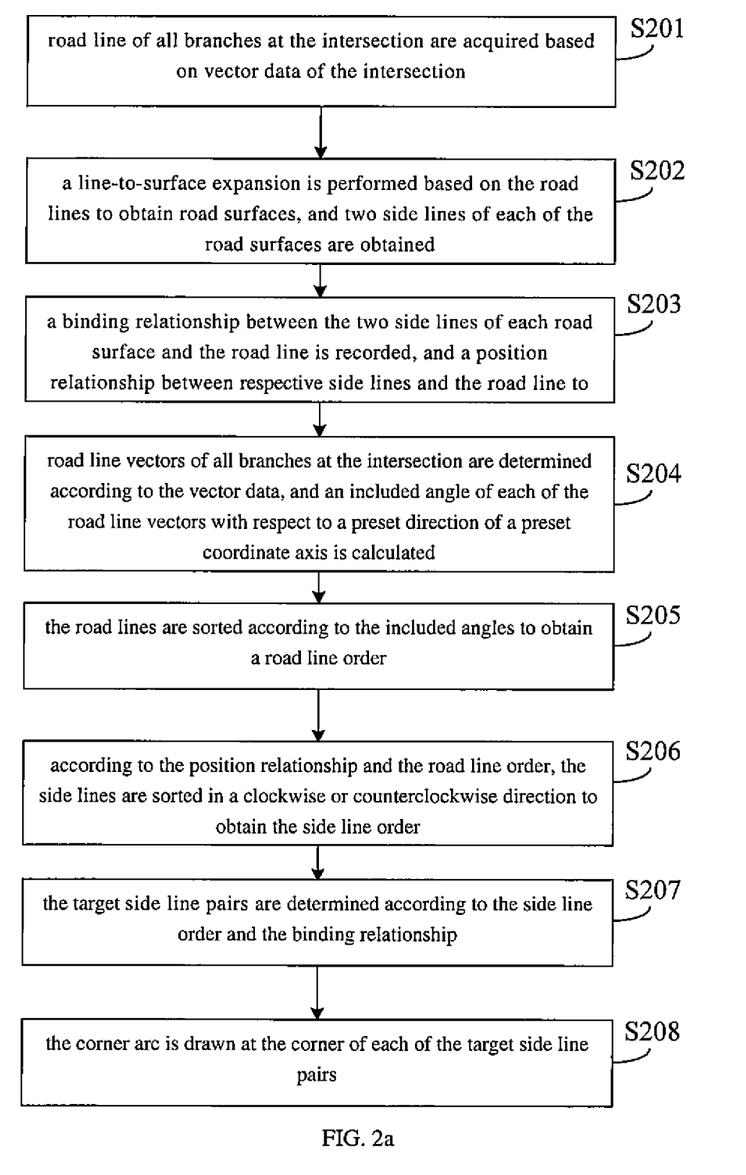
FIG. 2a is a flowchart of a method for drawing an intersection according to some embodiments of the present disclosure.

FIG. 2a is a flowchart of a method for drawing an intersection according to some embodiments of the present disclosure. The embodiment is on the basis of the above embodiments. As shown in FIG. 2a, the method includes the following acts.

At block S201, road lines of all branches at the intersection are acquired based on vector data of the intersection.

At block S202, a line-to-surface expansion is performed based on the road lines to obtain road surfaces, and two side lines of each of the road surfaces are obtained.

At block S203, a binding relationship between the two side lines of each road surface and the road line is recorded, and a position relationship between respective side lines and the road line to which the side line belongs is recorded, the position relationship includes being located on left or right of the road line.

In order to determine the target side line pair that needs to draw the corner arc, and prevent from drawing the corner arc at the two side lines expanded from the same road, after the road surface is determined, the binding relationship between the two side lines of each road surface and the road line can be recorded. In an example, the binding relationship includes the relationship between each road line and its left and right side lines. Illustratively, as shown in FIG. 1b, taking the road line being the center line as an example, it is recorded that the center line of the side line a1 and a2 is a, the side line a1 is located on the left side of the center line a, the side line a2 is located on the right side of the center line a. By analogy, the center line b, c, d and the corresponding binding relationship can be obtained.

At block S204, road line vectors of all branches at the intersection are determined according to the vector data, and an included angle of each of the road line vectors with respect to a preset direction of a preset coordinate axis is calculated.

In an example, the preset direction includes a positive direction and a negative direction.

At block S205, the road lines are sorted according to the included angles to obtain a road line order.

The relationship between the road line and the side lines is obtained at block 203, and it is also determined whether the side line is located on the left or right side of the road line, thus the sorting of the side lines may be determined by the sorting of the road lines, and then based on the order of the road lines obtained and the positional relationship between the side lines and the road lines, the order of the side lines can be obtained.

In an example, the road line vectors of all branches at the intersection are determined according to the vector data of the road, and the included angle of each of the road line vectors with respect to the preset direction of the preset coordinate axis is determined. The preset direction includes a positive direction and a negative direction. Illustratively, as shown in FIG. 1b, as an example, the road line is the center line, xy axis is the preset coordinate axis, x axis is the horizontal axis, the y axis is the vertical axis, and the positive direction of the x axis is the preset direction. By calculation, it may be obtained that the included angle between the center line c and the positive direction of x axis is 0, the included angle between the center line b and the positive direction of x axis is 90, the included angle between the center line a and the positive direction of x axis is 180, and the included angle between the center line d and the positive direction of x axis is 270, when it is sorted based on the sizes of the included angles in an ascending order, the order of the center lines in a counterclockwise manner, i.e., c b, a, and d, may be obtained At block S206, according to the position relationship and the road line order, the side lines are sorted in a clockwise or counterclockwise direction to obtain the side line order.

In the above example, as shown in FIG. 1b, when the position relationship between each side line and the center lines is known, the side line order c2, c1, b2, b1, a2, a1, d2 and d1 may be obtained according to the center line order c, b, a, d.

At block S207, the target side line pairs are determined according to the side line order and the binding relationship.

Further, in the above example, as shown in FIG. 1b, according to the side line order and the binding relationship, all target side line pairs, including c1 and b2, b1 and a2, a1 and d2, and d1 and c2, can be determined.

It should be noted that, after the included angle of each road line vector with respect to the preset direction of the preset coordinate axis is determined, it may be sorted in a descending order (from high to low) or ascending order (from low to high) of the included angles. In addition, the coordinate axis may be determined according to actual requirements, which is not limited in embodiments of the present disclosure.

At block S208, the corner arc is drawn at the corner of each of the target side line pairs.

Figure 2B:
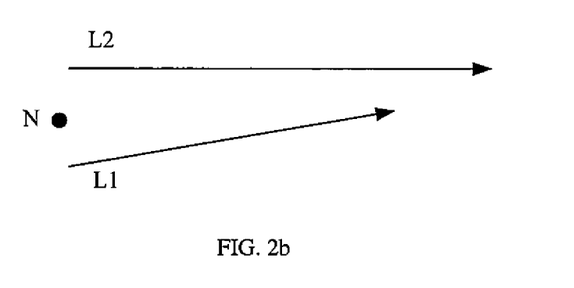
FIG. 2b is a schematic diagram illustrating approximately parallel side lines according to some embodiments of the present disclosure.

In an example, there is a case where the two side lines are approximately parallel, for example, the included angle between a main road and a side road is small, and the main road is approximately parallel to the side road. In this case, when it is sorted according to the included angles, there may be errors. Illustratively, FIG. 2b is a schematic diagram illustrating approximately parallel side lines according to some embodiments of the present disclosure, as shown in FIG. 2b, the side lines L1 and L2 are approximately parallel, when the positive direction of the horizontal axis is the preset direction of the preset coordinate axis, according to the above method, it may be determined that the included angle corresponding to the side line L2 is less than the included angle corresponding to the side line L1. When it is sorted in the ascending order of the included angles, order of the side lines in the counterclockwise manner is L2, L1. However, the actual order of the side lines in the counterclockwise manner is L1, L2, an error occurs, and it is required to correct.

In an example, determining the target side line pair according to the side line order and the binding relationship (block S207) further includes acts of: determining whether there are at least two parallel side lines in the side lines according to a preset angle threshold; in any two target parallel side lines, selecting a target point on one of the two target parallel side lines, and determining a target position relationship between the target point and the other of the two target parallel side lines by using a cross product method; correcting the side line order according to the target position relationship; and determining the target side line pairs according to the side line order corrected and the binding relationship.

In an example, the order of two approximately parallel side lines is corrected. After all the side line pairs are obtained, at least two parallel side lines, such as L2 and L1 in FIG. 2b, in the side lines may be determined according to the preset angle threshold. The preset angle threshold may be configured to determine the intersection or parallel of the side lines. A point K on the side line L2 is taken as the target point, a vector product of the point K and the side line L1 can be calculated by using the cross product method, and the target position relationship between the target point K and the side line L1 may be determined according to the calculation result. In FIG. 2b, the point K is located on the left side of the side line L1. When the determined order of the side lines in the counterclockwise manner is L2, L1, any point on the side line L2 should be at the right side of the side line L1. Thus, it may be determined that the determined order does not match the actual result, and then the order of the side lines may be corrected according to the target position relationship.

After correction, the target side line pairs may be determined according to the side line order corrected and the binding relationship, such that the target side line pair that needs to draw the corner arc may be accurately determined, and the accuracy of drawing the intersection can be improved.

With the method according to embodiments of the present disclosure, the road lines all branches at the intersection are obtained based on the vector data of the intersection, the road surfaces are acquired by line-to-surface expansion, and a rough intersection is drawn, and then by drawing the corner arc at the target side line pair, a fine intersection can be obtained, such that the high-definition intersection can be drawn quickly, the intersection can be drawn in fine detail, the costs of manual drawing can be reduced, the drawn intersection is close to the real world. Moreover, in the process of determining the target side line pairs that needs to draw the corner arc, by sorting and then correcting the order of the side lines determined, the accuracy of the order of the side lines determined can be improved, and the accuracy of drawing the intersection can be improved.

Figure 3A:
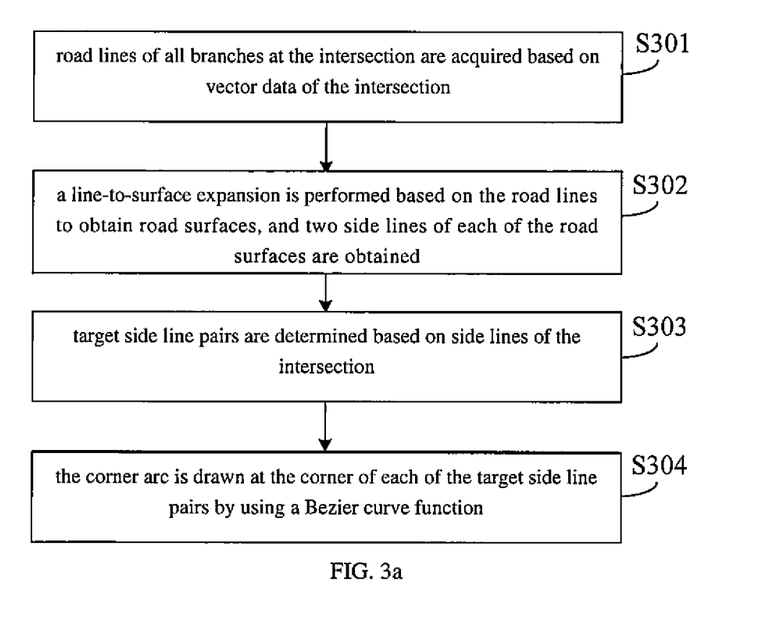
FIG. 3a is a flowchart of a method for drawing an intersection according to some embodiments of the present disclosure.

FIG. 3a is a flowchart of a method for drawing an intersection according to some embodiments of the present disclosure. The embodiment is on the basis of the above embodiments. As shown in FIG. 3a, the method includes the following operations.

At block S301, road lines of all branches at the intersection are acquired based on vector data of the intersection.

At block S302, a line-to-surface expansion is performed based on the road lines to obtain road surfaces, and two side lines of each of the road surfaces are obtained.

At block S303, target side line pairs are determined based on side lines of the intersection.

In some embodiments, each target side line pair includes two side lines that do not belong to the same road line and are adjacent to each other.

At block S304, the corner arc is drawn at the corner of each of the target side line pairs by using a Bezier curve function.

In an example, drawing the corner arc at the corner of each of the side line pairs by using the Bezier curve function includes acts of: for a non-parallel side line pair, drawing the corner arc by using a second-order Bezier curve function; and for a parallel side line pair, drawing the corner arc by using a third-order Bezier curve function.

In an example, whether a side line pair is the parallel side line pair or the non-parallel side line pair is determined according to a preset angle threshold. The parallel side line pair may refer to a side line pair including two side lines that are parallel. The non-parallel side line pair may refer to a side line pair including two side lines that are not parallel.

In an example, drawing the corner arc at the corner of each of the side line pairs by using the Bezier curve function further includes acts of: according to the vector data, drawing the corner arc at the corner of a target side line pair by using the third-order Bezier curve function, when the two side lines in the target side line pair intersect in a direction away from a center of the intersection to which the target side line pair belongs.

In some embodiments of the present disclosure, different conditions of the side line pairs are considered, and the corner arc is drawn by using the Bezier curve function with different orders. For the non-parallel side line pair, the corner arc is drawn by using the second-order Bezier curve function, and for the parallel side line pair, the corner arc is drawn by using the third-order Bezier curve function. It should be noted that, in actual road conditions, the parallel side lines here may refer to approximately parallel, i.e., the parallel of two side lines is determined according to the preset angle threshold, when the included angle of two side lines is less than the preset angle threshold, it is determined that the two side lines are parallel, and they belong to the parallel side line pair. For a particular side line pair, i.e., the two side lines in this side line pair intersect in the direction away from the center of the intersection to which the side line pair belongs, the corner arc is drawn at the corner of the side line pair by using the third-order Bezier curve function. Although the two side lines in the particular side line pair are approximately parallel, when it is determined whether there is the parallel side line pair by using the preset angle threshold, in reality, some approximately parallel side line pairs may be missed due to inaccuracy of the raw vector data, thus it is necessary to select, according to the characteristics of the side line pairs, the particular side line pair that also needs to draw the corner arc by using the third-order Bezier curve function, so as to improve the accuracy.

In an example, control points of the second-order Bezier curve function include an intersection point of each target side line pair, and foot points of an offset point on respective side lines in each target side line pair. The offset point is on the road line to which the target side line pair belongs. The control points of the third-order Bezier curve function include end points on the target side line pair close to the intersection to which the target side line pair belongs, and the foot points of the offset points on road line to which the target side line pair belongs on respective side lines in the target side line pair. The offset point is on the road line to which the target side line pair belongs.

In an example, the offset point is determined by acts of: obtaining an intersection surface of the road surfaces to which the two side lines in the target side line pair belongs, and obtaining an intersection point of the road lines to which the target side line pair belongs; determining, from all points on the intersection surface, a point having a maximum distance to the intersection point of the road lines; calculating a sum of the distance and a preset threshold as an offset length; and on the road lines to which the target side line pair belongs, determining a point at the offset length from the intersection point as the offset point.

Figure 3B:
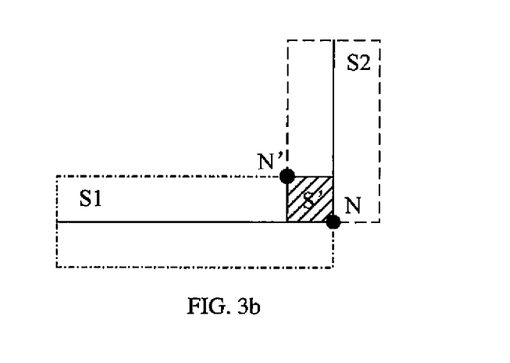
FIG. 3b to FIG. 3e are schematic diagrams of determining control points of a Bezier curve function according to some embodiments of the present disclosure.
Figure 3C:
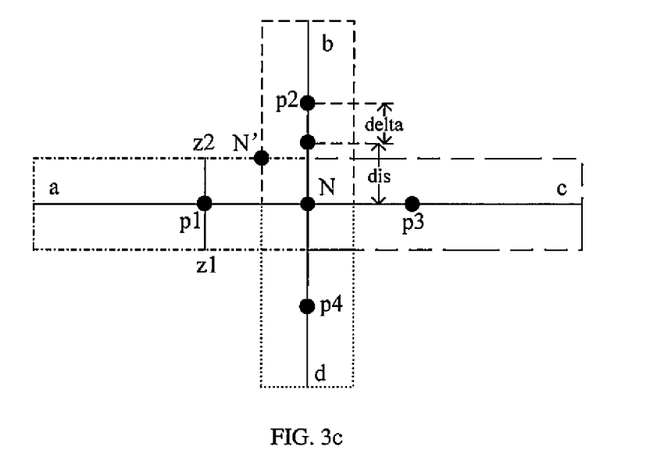

Specifically, as an example, the feature point N is the center point of the intersection, and the road line is the center line, as shown in FIG. 3b, the intersection surface of the road surfaces S1 and S2 is S', and the intersection point of the road lines to which the target side line pair belongs is the center point N. In the intersection surface S', the point N' has the maximum distance to the intersection point N, and the distance between N' and N is denoted as dis. As shown in FIG. 3c, the offset length can be obtained by adding disc and a preset threshold delta (an experience value), and on the center lines a, b, c and d, the points p1, p2, p3 and p4 at the offset length away from the center point N are four offset points. The points z1 and z2 are foot points of the offset point p1 on respective side lines of the center line a, and the foot points of other offset points on their respective center lines are not shown in FIG. 3c.

Figure 3D:
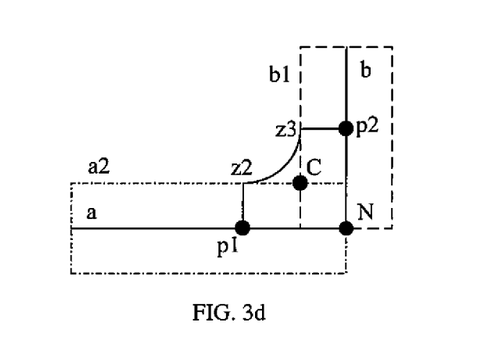
Figure 3E:
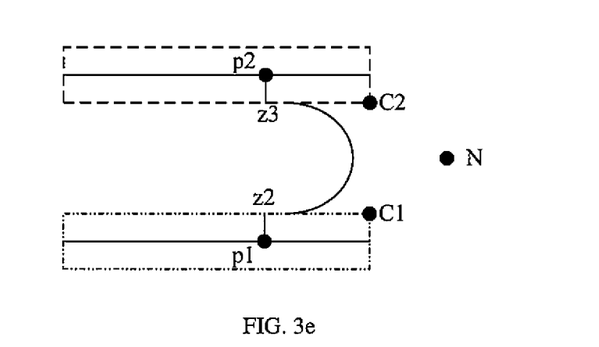

In addition, the feature point N is the center point of the intersection, and the road line is the center line, FIG. 3d illustrates control points of a second-order Bezier curve function, and FIG. 3e illustrates control points of a third-order Bezier curve function. As shown in FIG. 3d, the control points of the second-order Bezier curve function may include the intersection point C of the side line pair a2 and b1, and the foot points z2, z3, in which z2 is the foot point of the offset point p1 on the center line a to which the side line pair belongs, z3 is the foot point of the offset point p2 on the center line b to which the side line pair belongs. As shown in FIG. 3e, the control points of the third-order Bezier curve function include the end points C1, C2 on the side line pair close to the intersection to which the side line pair belongs, and the foot points z2 and z3.

With the method according to embodiments of the present disclosure, the road lines all branches at the intersection are obtained based on the vector data of the intersection, the road surfaces are acquired by line-to-surface expansion, and a rough intersection is drawn, and then by drawing the corner arc at the target side line pair, a fine intersection can be obtained, such that the high-definition intersection can be drawn quickly, the intersection can be drawn in fine detail, the costs of manual drawing can be reduced, the drawn intersection is close to the real world, and the accuracy of drawing the intersection can be improved.

Figure 4:
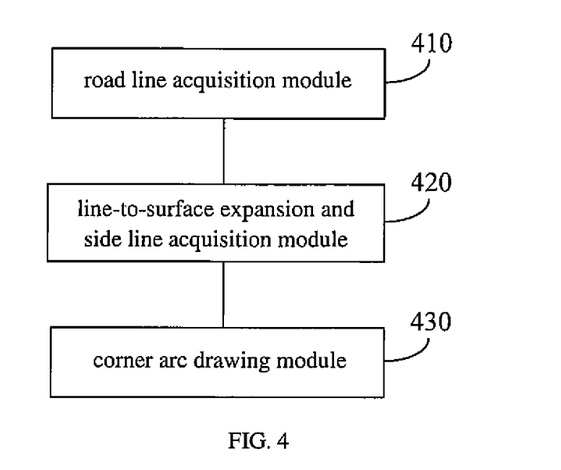
FIG. 4 is a schematic diagram of a device for drawing an intersection according to some embodiments of the present disclosure.

FIG. 4 is a schematic diagram of a device for drawing an intersection according to some embodiments of the present disclosure. As shown in FIG. 4, the device includes: a road line acquisition module 410, a line-to-surface expansion and side line acquisition module 420, and a corner arc drawing module 430.

The road line acquisition module 410 is configured to acquire road lines of all branches at the intersection based on vector data of the intersection. The line-to-surface expansion and side line acquisition module 420 is configured to perform a line-to-surface expansion according to the road lines to obtain road surfaces, and acquire two side lines of each of the road surfaces. The corner arc drawing module 430 is configured to target side line pairs based on side lines of the intersection, and draw a corner arc at a corner of each of the target side line pairs. Each of the target side line pairs includes two side lines that do not belong to the same road line and are adjacent to each other.

In at least one embodiment, the line-to-surface expansion and side line acquisition module 420 is further configured to: based on each road line, expand to both sides of the road line by taking an intersection width as an expansion distance, to obtain the two side lines of each of the road surfaces of all branches at the intersection.

In at least one embodiment, the device further includes a recording module. The recording module is configured to record a binding relationship between the two side lines of each of the road surfaces and the road line, and record a position relationship between respective side lines and the road line to which the side line belongs. The position relationship includes being located on left or right of the road line In at least one embodiment, the corner arc drawing module 430 includes a side line pair determining unit. The side line pair determining unit includes an included angle calculation subunit, a center line order determining subunit, a side line order determining subunit, and a side line pair determining subunit.

The included angle calculation subunit is configured to determine road line vectors of all the branches at the intersection according to the vector data, and calculate an included angle of each of the road line vectors with respect to a preset direction of a preset coordinate axis. The preset direction includes a positive direction and a negative direction. The center line order determining subunit is configured to sort the road lines according to the included angles to obtain a road line order. The side line order determining subunit is configured to sort, according to the position relationship and the road line order, the side lines in a clockwise or counterclockwise manner to obtain a side line order. The side line pair determining subunit is configured to determine the target side line pairs according to the side line order and the binding relationship.

In at least one embodiment, the side line pair determining subunit is further configured to determine whether there are at least two parallel side lines according to a preset angle threshold; in any two target parallel side lines, select a target point on one of the two target parallel side lines, and determine a target position relationship between the target point and the other of the two target parallel side lines by using a cross product method; correct the side line order according to the target position relationship; and determine the target side line pairs according to the side line order corrected and the binding relationship.

In at least one embodiment, the corner arc drawing module 430 includes a corner drawing unit, which is configured to draw the corner arc at the corner of each of the target side line pairs by using a Bezier curve function.

In at least one embodiment, the corner drawing unit includes: a first corner drawing unit and a second corner drawing unit. The first corner drawing unit is configured to, for a non-parallel side line pair, draw the corner arc by using a second-order Bezier curve function. The second corner drawing unit is configured to, for a parallel side line pair, draw the corner arc by using a third-order Bezier curve function.

In some embodiments, whether a side line pair is the parallel side line pair or the non-parallel side line pair is determined according to a preset angle threshold.

In at least one embodiment, the corner drawing unit further includes a third corner drawing unit. The third corner drawing unit is configured to, according to the vector data, draw the corner arc at the corner of a target side line pair by using the third-order Bezier curve function, when the two side lines in the target side line pair intersect in a direction away from a center of the intersection to which the target side line pair belongs.

In at least one embodiment, control points of the second-order Bezier curve function include an intersection point of each target side line pair, and foot points of an offset point on respective side lines in each target side line pair. The offset point is on the road line to which the target side line pair belongs. The control points of the third-order Bezier curve function include end points on the target side line pair close to the intersection to which the target side line pair belongs, and the foot points of the offset points on road line to which the target side line pair belongs on respective side lines in the target side line pair. The offset point is on the road line to which the target side line pair belongs.

In at least one embodiment, the offset point is determined by acts of: obtaining an intersection surface of the road surfaces to which the two side lines in the target side line pair belongs, and obtaining an intersection point of the road lines to which the target side line pair belongs; determining, from all points on the intersection surface, a point having a maximum distance to the intersection point of the road lines; calculating a sum of the distance and a preset threshold as an offset length; and on the road lines to which the target side line pair belongs, determining a point at the offset length from the intersection point as the offset point.

In at least one embodiment, the device further includes a road convex hull drawing module, and a corner arc replacing module.

The road convex hull drawing module is configured to draw, according to the vector data, a road convex hull based on the road surfaces by using a convex hull method. In the road convex hull, a road corner is represented by a straight line. The corner arc replacing module is configured to, after the corner arc drawing module 430 draws the corner arc at the corner of each of the target side line pairs, replace the straight line in the road convex hull with the corner arc.

The device for drawing an intersection according to embodiments of the present disclosure may perform the method for drawing an intersection according to any embodiment of the present disclosure, and has functional modules for executing the method and beneficial effects.

Figure 5:
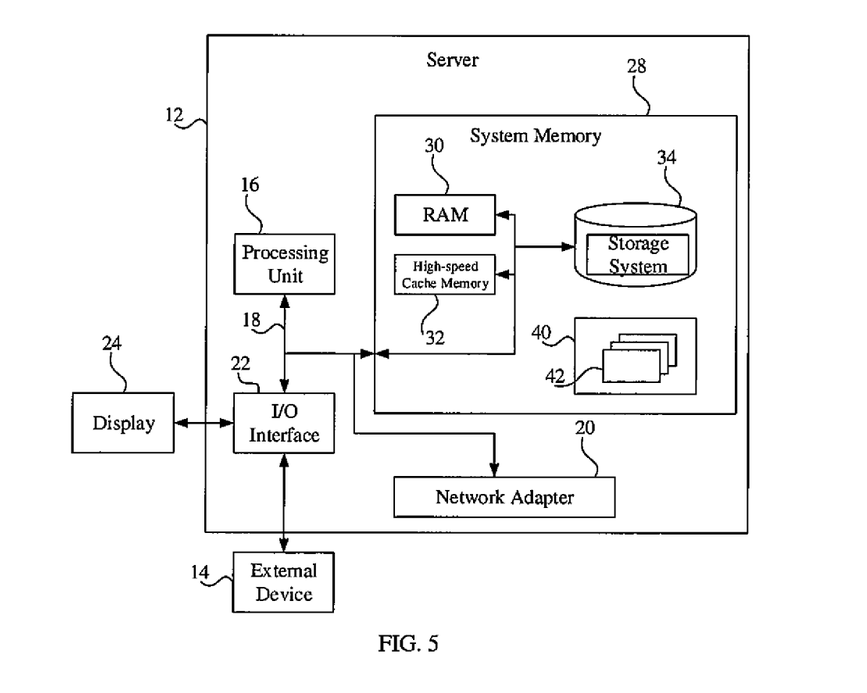
FIG. 5 is a schematic diagram of a server according to some embodiments of the present disclosure.

FIG. 5 is a schematic diagram of a server according to some embodiments of the present disclosure. FIG. 5 is a block diagram of a server 12 for implementing embodiments of the present disclosure. The server 12 illustrated in FIG. 5 is only illustrated as an example, and should not be considered as any restriction on the function and the usage scope of embodiments of the present disclosure.

As illustrated in FIG. 5, the server 12 is in the form of a general-purpose computing device. The server 12 may include, but is not limited to, one or more processors or processing units 16, a system memory 28, and a bus 18 connecting different system components (including the system memory 28 and the processing unit 16).

The bus 18 represents one or more of several types of bus architectures, including a memory bus or a memory control bus, a peripheral bus, a graphic acceleration port (GAP) bus, a processor bus, or a local bus using any bus architecture in a variety of bus architectures. For example, these architectures include, but are not limited to, an industry standard architecture (ISA) bus, a micro-channel architecture (MCA)

bus, an enhanced ISA bus, a video electronic standards association (VESA) local bus, and a peripheral component interconnect (PCI) bus.

Typically, the server 12 may include multiple kinds of computer-readable media. These media may be any storage media accessible by the server 12, including transitory or non-transitory storage medium and movable or unmovable storage medium.

The memory 28 may include a computer-readable medium in a form of volatile memory, such as a random-access memory (RAM) 30 and/or a high-speed cache memory 32. The server 12 may further include other transitory/non-transitory storage media and movable/unmovable storage media. In way of example only, the storage system 34 may be configured to read and write non-removable, non-volatile magnetic media (not shown in the figure, commonly referred to as "hard disk drives"). Although not illustrated in FIG. 5, it may be provided a disk driver for reading and writing movable non-volatile magnetic disks (e.g. "floppy disks"), as well as an optical driver for reading and writing movable non-volatile optical disks (e.g. a compact disc read only memory (CD-ROM, a digital video disc read only Memory (DVD-ROM), or other optical media). In these cases, each driver may be connected to the bus 18 via one or more data medium interfaces. The memory 28 may include at least one program product, which has a set of (for example at least one) program modules configured to perform the functions of embodiments of the present disclosure.

A program/application 40 with a set of (at least one) program modules 42 may be stored in memory 28, the program modules 42 may include, but not limit to, an operating system, one or more application programs, other program modules and program data, and any one or combination of above examples may include an implementation in a network environment. The program modules 42 are generally configured to implement functions and/or methods described in embodiments of the present disclosure.

The server 12 may also communicate with one or more external devices 14 (e.g., a keyboard, a pointing device, a display 24, and etc.) and may also communicate with one or more devices that enables a user to interact with the computer system/server 12, and/or any device (e.g., a network card, a modem, and etc.) that enables the computer system/server 12 to communicate with one or more other computing devices. This kind of communication can be achieved by the input/output (I/O) interface 22. In addition, the server 12 may be connected to and communicate with one or more networks such as a local area network (LAN), a wide area network (WAN) and/or a public network such as the Internet through a network adapter 20. As shown in FIG. 9, the network adapter 20 communicates with other modules of the server 12 over bus 18. It should be understood that although not shown in the figure, other hardware and/or software modules may be used in combination with the server 12, which including, but not limited to, microcode, device drivers, redundant processing units, external disk drive arrays, RAID systems, tape drives, as well as data backup storage systems and the like.

The processing unit 16 can perform various functional applications and data processing by running programs stored in the system memory 28, for example, to perform the method according to embodiments of the present disclosure. The method includes: acquiring road lines of all branches at the intersection based on vector data of the intersection; performing a line-to-surface expansion based on the road lines to obtain road surfaces, and acquiring two side lines of each of the road surfaces; and determining target side line pairs based on side lines of the intersection, and drawing a corner arc at a corner of each of the target side line pairs. Each of the target side line pairs includes two side lines that do not belong to the same road line and are adjacent to each other.

Embodiments of the present disclosure further provides a computer readable storage medium having a computer program stored thereon. When the program is executed by a processor, the processor is configured to implement the method according to embodiments of the present disclosure. The method includes: acquiring road lines of all branches at the intersection based on vector data of the intersection; performing a line-to-surface expansion based on the road lines to obtain road surfaces, and acquiring two side lines of each of the road surfaces; and determining target side line pairs based on side lines of the intersection, and drawing a corner arc at a corner of each of the target side line pairs. Each of the target side line pairs includes two side lines that do not belong to the same road line and are adjacent to each other.

The computer storage medium may adopt any combination of one or more computer readable media. The computer readable medium may be a computer readable signal medium or a computer readable storage medium. The computer readable storage medium may be, but is not limited to, for example, an electrical, magnetic, optical, electromagnetic, infrared, or semiconductor system, apparatus, device, component or any combination thereof. A specific example of the computer readable storage media include (a non-exhaustive list): an electrical connection having one or more wires, a portable computer disk, a hard disk, a random access memory (RAM), a read only memory (ROM), an Erasable Programmable Read Only Memory (EPROM) or a flash memory, an optical fiber, a compact disc read-only memory (CD-ROM), an optical memory component, a magnetic memory component, or any suitable combination thereof. In context, the computer readable storage medium may be any tangible medium including or storing programs. The programs may be used by an instruction executed system, apparatus or device, or a connection thereof.

The computer readable signal medium may include a data signal propagating in baseband or as part of carrier which carries a computer readable program code. Such propagated data signal may be in many forms, including but not limited to an electromagnetic signal, an optical signal, or any suitable combination thereof. The computer readable signal medium may also be any computer readable medium other than the computer readable storage medium, which may send, propagate, or transport programs used by an instruction executed system, apparatus or device, or a connection thereof.

The program code stored on the computer readable medium may be transmitted using any appropriate medium, including but not limited to wireless, wireline, optical fiber cable, RF, or any suitable combination thereof.

The computer program code for carrying out operations of embodiments of the present disclosure may be written in one or more programming languages. The programming language includes an object-oriented programming language, such as Java, Smalltalk, C++, as well as conventional procedural programming language, such as "C" language or similar programming language. The program code may be executed entirely on a user's computer, partly on the user's computer, as a separate software package, partly on the user's computer, partly on a remote computer, or entirely on the remote computer or server. In a case of the remote computer, the remote computer may be connected to the user's computer or an external computer (such as using an Internet service provider to connect over the Internet) through any kind of network, including a Local Area Network (hereafter referred as to LAN) or a Wide Area Network (hereafter referred as to WAN).

It should be noted that, the above are only preferred embodiments and applied technical principles of the present disclosure. Those skilled in the art should understand that, the present disclosure is not limited to the specific embodiments described herein, and various obvious changes, readjustments and substitutions that are made by those skilled in the art will not depart from the scope of the present disclosure. Therefore, although the present disclosure has been described in detail by the above embodiments, the present disclosure is not limited to the above embodiments, and more other equivalent embodiments may be included without departing from the concept of the present disclosure, and the scope of the present disclosure is determined by the scope of the appended claims.

What is claimed is:

1. A method for drawing an intersection, comprising:
   acquiring road lines of all branches at the intersection based on vector data of the intersection;
   performing a line-to-surface expansion based on the road lines to obtain road surfaces, and acquiring two side lines of each of the road surfaces; and
   determining target side line pairs based on side lines of the intersection, and drawing a corner arc at a corner of each of the target side line pairs, wherein each of the target side line pairs comprises two side lines that do not belong to the same road line and are adjacent to each other;
   the method further comprises:
   recording a binding relationship between the two side lines of each of the road surfaces and the road line, and recording a position relationship between respective side lines and the road line to which the side line belongs, wherein the position relationship comprises being located on left or right of the road line,
   wherein determining the target side line pairs comprises:
   determining road line vectors of all the branches at the intersection according to the vector data, and calculating an included angle of each of the road line vectors with respect to a preset direction of a preset coordinate axis, wherein the preset direction comprises a positive direction and a negative direction;
   sorting the road lines according to the included angles to obtain a road line order;
   sorting, according to the position relationship and the road line order, the side lines in a clockwise or counterclockwise manner to obtain a side line order; and
   determining the target side line pairs according to the side line order and the binding relationship.

2. The method according to claim 1, wherein performing the line-to-surface expansion based on the road lines to obtain the road surfaces and acquiring the two side lines of each of the road surfaces comprises:
   based on each road line, expanding to both sides of the road line by taking an intersection width as an expansion distance, to obtain the two side lines of each of the road surfaces of all branches at the intersection.

3. The method according to claim 1, wherein determining the target side line pairs according to the side line order and the binding relationship comprises:
   determining whether there are at least two parallel side lines according to a preset angle threshold;
   in any two target parallel side lines, selecting a target point on one of the two target parallel side lines, and determining a target position relationship between the target point and the other of the two target parallel side lines by using a cross product method;
   correcting the side line order according to the target position relationship; and
   determining the target side line pairs according to the side line order corrected and the binding relationship.

4. The method according to claim 1, wherein drawing the corner arc at the corner of each of the target side line pairs comprises:
   drawing the corner arc at the corner of each of the target side line pairs by using a Bezier curve function.

5. The method according to claim 4, wherein drawing the corner arc at the corner of each of the target side line pairs by using the Bezier curve function comprises:
   for a non-parallel side line pair, drawing the corner arc by using a second-order Bezier curve function; and
   for a parallel side line pair, drawing the corner arc by using a third-order Bezier curve function;
   wherein whether a side line pair is the parallel side line pair or the non-parallel side line pair is determined according to a preset angle threshold.

6. The method according to claim 5, wherein,
   control points of the second-order Bezier curve function comprise an intersection point of each target side line pair, and foot points of an offset point on respective side lines in each target side line pair, wherein the offset point is on the road line to which the target side line pair belongs;
   control points of the third-order Bezier curve function comprise end points on the target side line pair close to the intersection to which the target side line pair belongs, and the foot points of the offset points on road line to which the target side line pair belongs on respective side lines in the target side line pair, wherein the offset point is on the road line to which the target side line pair belongs;
   wherein the offset point is determined by acts of:
   obtaining an intersection surface of the road surfaces to which the two side lines in the target side line pair belongs, and obtaining an intersection point of the road lines to which the target side line pair belongs;
   determining, from all points on the intersection surface, a point having a maximum distance to the intersection point of the road lines;
   calculating a sum of the distance and a preset threshold as an offset length; and
   on the road lines to which the target side line pair belongs, determining a point at the offset length from the intersection point as the offset point.

7. The method according to claim 4, wherein drawing the corner arc at the corner of each of the target side line pairs by using the Bezier curve function comprises:
   according to the vector data, drawing the corner arc at the corner of a target side line pair by using the third-order Bezier curve function, when the two side lines in the target side line pair intersect in a direction away from a center of the intersection to which the target side line pair belongs.

8. The method according to claim 1, further comprising:
   drawing, according to the vector data, a road convex hull based on the road surfaces by using a convex hull method, wherein in the road convex hull, a road corner is represented by a straight line; and wherein after drawing the corner arc at the corner of each of the target side line pairs, the method further comprises:
replacing the straight line in the road convex hull with the corner arc.

9. A device for drawing an intersection, comprising:
one or more processors; and
a storage device, configured to store one or more programs,
wherein when the one or more programs are executed by the one or more processors, the one or more processors are configured to:
acquire road lines of all branches at the intersection based on vector data of the intersection;
perform a line-to-surface expansion according to the road lines to obtain road surfaces, and acquire two side lines of each of the road surfaces; and
determine target side line pairs based on side lines of the intersection, and draw a corner arc at a corner of each of the target side line pairs, wherein each of the target side line pairs comprises two side lines that do not belong to the same road line and are adjacent to each other;
wherein the one or more processors are further configured to:
record a binding relationship between the two side lines of each of the road surfaces and the road line, and record a position relationship between respective side lines and the road line to which the side line belongs, wherein the position relationship comprises being located on left or right of the road line,
wherein the one or more processors are further configured to:
determine road line vectors of all the branches at the intersection according to the vector data, and calculate an included angle of each of the road line vectors with respect to a preset direction of a preset coordinate axis, wherein the preset direction comprises a positive direction and a negative direction;
sort the road lines according to the included angles to obtain a road line order;
sort, according to the position relationship and the road line order, the side lines in a clockwise or counterclockwise manner to obtain a side line order; and
determine the target side line pairs according to the side line order and the binding relationship.

10. The device according to claim 9, wherein the one or more processors are further configured to:
based on each road line, expand to both sides of the road line by taking an intersection width as an expansion distance, to obtain the two side lines of each of the road surfaces of all branches at the intersection.

11. The device according to claim 9, wherein the one or more processors are further configured to:
determine whether there are at least two parallel side lines according to a preset angle threshold;
in any two target parallel side lines, select a target point on one of the two target parallel side lines, and determine a target position relationship between the target point and the other of the two target parallel side lines by using a cross product method;
correct the side line order according to the target position relationship; and
determine the target side line pairs according to the side line order corrected and the binding relationship.

12. The device according to claim 9, wherein the one or more processors are further configured to:
draw the corner arc at the corner of each of the target side line pairs by using a Bezier curve function.

13. The device according to claim 12, wherein the one or more processors are further configured to:
for a non-parallel side line pair, draw the corner arc by using a second-order Bezier curve function; and
for a parallel side line pair, draw the corner arc by using a third-order Bezier curve function;
wherein whether a side line pair is the parallel side line pair or the non-parallel side line pair is determined according to a preset angle threshold.

14. The device according to claim 13, wherein,
control points of the second-order Bezier curve function comprise an intersection point of each target side line pair, and foot points of an offset point on respective side lines in each target side line pair, wherein the offset point is on the road line to which the target side line pair belongs;
control points of the third-order Bezier curve function comprise end points on the target side line pair close to the intersection to which the target side line pair belongs, and the foot points of the offset points on road line to which the target side line pair belongs on respective side lines in the target side line pair, wherein the offset point is on the road line to which the target side line pair belongs;
wherein the offset point is determined by acts of:
obtaining an intersection surface of the road surfaces to which the two side lines in the target side line pair belongs, and obtaining an intersection point of the road lines to which the target side line pair belongs;
determining, from all points on the intersection surface, a point having a maximum distance to the intersection point of the road lines;
calculating a sum of the distance and a preset threshold as an offset length; and
on the road lines to which the target side line pair belongs, determining a point at the offset length from the intersection point as the offset point.

15. The device according to claim 12, wherein the one or more processors are further configured to:
according to the vector data, draw the corner arc at the corner of a target side line pair by using the third-order Bezier curve function, when the two side lines in the target side line pair intersect in a direction away from a center of the intersection to which the target side line pair belongs.

16. The device according to claim 9, wherein the one or more processors are further configured to:
draw, according to the vector data, a road convex hull based on the road surfaces by using a convex hull method, wherein in the road convex hull, a road corner is represented by a straight line; and
replace the straight line in the road convex hull with the corner arc.

17. A non-transitory computer readable storage medium having a computer program stored thereon, wherein when the program is executed by a processor, causes a method for drawing an intersection to be implemented, the method comprising:
acquiring road lines of all branches at the intersection based on vector data of the intersection;
performing a line-to-surface expansion based on the road lines to obtain road surfaces, and acquiring two side lines of each of the road surfaces; and
determining target side line pairs based on side lines of the intersection, and drawing a corner arc at a corner of each of the target side line pairs, wherein each of the target side line pairs comprises two side lines that do not belong to the same road line and are adjacent to each other;

the method further comprises:

recording a relationship between the two side lines of the road surfaces and the road line, and recording a position relationship between respective side lines and the road line to which the side belongs, wherein the position relationship, comprises being located on left or right of the road line, wherein determining the target side line pairs comprises:

determining road line vectors of all the branches at the intersection according to the vector data, and calculating an included angle of each of the road line vectors with respect to a preset direction of a preset coordinate axis, wherein the preset direction comprises a positive direction and a negative direction;

sorting the road lines according to the included angles to obtain a road line order;

sorting, according to the position relationship and the road line order, the side lines in a clockwise or counterclockwise manner to obtain a side line order; and determining the target side line pairs according the side order and the binding relationship.

18. The non-transitory computer readable storage medium according to claim 17, wherein performing the line-to-surface expansion based on the road lines to obtain the road surfaces and acquiring the two side lines of each of the road surfaces comprises:

based on each road line, expanding to both sides of the road line by taking an intersection width as an expansion distance, to obtain the two side lines of each of the road surfaces of all branches at the intersection.

* * * * *